United States Patent [19]

Hayakawa

[11] Patent Number: 4,709,204

[45] Date of Patent: Nov. 24, 1987

[54] LIMITER CIRCUIT

[75] Inventor: Mitsuru Hayakawa, Iwai, Japan

[73] Assignee: Victor Company of Japan, Ltd., Japan

[21] Appl. No.: 932,186

[22] Filed: Nov. 18, 1986

[30] Foreign Application Priority Data

Dec. 2, 1985 [JP] Japan .................................. 60-271143

[51] Int. Cl.$^4$ .............................................. G05F 5/08
[52] U.S. Cl. .................................... 323/303; 307/557;
307/351; 307/360
[58] Field of Search ................ 323/303; 307/540, 552,
307/557, 558, 350, 351, 354, 358, 360; 328/117,
146, 147

[56] References Cited

U.S. PATENT DOCUMENTS

| 3,465,170 | 9/1969 | Lavallee | 307/558 |
| 3,697,780 | 10/1972 | Michael et al. | 307/360 |
| 3,940,704 | 2/1976 | Bockett-Pugh | 328/147 X |
| 4,382,198 | 5/1983 | Ishijima et al. | 307/360 X |

Primary Examiner—Patrick R. Salce
Assistant Examiner—Kristine Peckman
Attorney, Agent, or Firm—Andrus, Sceales, Starke & Sawall

[57] ABSTRACT

A limiter circuit has an input versus output characteristic which is non-linear in a region outside a linear operating range thereof, so that an input voltage thereof converges to a predetermined voltage within the linear operating range even when the input voltage is outside the linear operating range of the limiter circuit.

11 Claims, 7 Drawing Figures

FIG. 5 ered erroneous in the VCO is discontinuous...

LIMITER CIRCUIT

BACKGROUND OF THE INVENTION

The present invention generally relates to limiter circuits, and more particularly to a limiter circuit having an input versus output characteristic which is non-linear in a region outside a linear operating range thereof.

As will be described later on in the present specification in conjunction with drawings, a conventional limiter circuit has an input versus output characteristic in which the upper and lower limit voltages are fixed. Accordingly, an output voltage of the limiter circuit is limited to the upper limit voltage even when an input voltage is greater than the upper limit voltage, and the output voltage of the limiter circuit is limited to the lower limit voltage even when the input voltage is smaller than the lower limit voltage.

As an example of the use of the limiter circuit, there is the case where the limiter circuit is used in a phase locked loop (PLL) circuit which includes a phase comparator and a voltage controlled oscillator (VCO). The phase comparator compares the phases of an input signal of the PLL circuit and an output signal of the VCO, and an oscillation frequency of the VCO is controlled by an output phase error voltage of the phase comparator. However, when the input signal of the PLL circuit becomes discontinuous (or intermittent) for some reason, for example, the operation of the PLL is disturbed and the PLL carries out an erroneous operation. Hence, the limiter circuit is provided at an input stage of the VCO. The limiter circuit limits the amplitude of the output phase error voltage of the phase comparator to a predetermined amplitude range even when the input signal of the PLL circuit becomes discontinuous, so as to prevent the erroneous operation of the PLL circuit. But since the oscillation frequency of the VCO is controlled from the upper or lower limit frequency after the input signal of the PLL circuit becomes discontinuous and the PLL circuit becomes an open loop, there is a problem in that a long setting time is required for the loop operation to reach the steady state. In other words, in the case where the phase error voltage is greater than the upper limit voltage or is smaller than the lower limit voltage of the limiter circuit, the phase error voltage is limited and fixed to the upper or lower limit voltage, and the phase error voltage will not converge to a voltage within a linear operating range between the upper and lower limit voltages of the limiter circuit.

As another example of the use of the limiter circuit, there is the case where the limiter circuit is used in a horizontal frequency oscillator circuit of a television receiver. The horizontal frequency oscillator circuit includes a frequency-to-voltage converter supplied with an external synchronizing signal, the limiter circuit and a VCO. The frequency-to-voltage converter outputs a voltage dependent on a frequency of the external synchronizing signal supplied thereto, and the limiter circuit limits the amplitude of this voltage before supplying the voltage to the VCO and controls an oscillation frequency of the VCO. Hence, even when a signal dropout and noise exist within the external synchronizing signal, the output voltage of the frequency-to-voltage converter is limited to a predetermined amplitude range and the VCO is prevented from carrying out an erroneous operation. However, an output voltage of the VCO is supplied to a horizontal deflection circuit which operates at a high voltage. For this reason, when the operating range of the VCO is set to a wide range by setting the upper limit voltage of the limiter circuit to a voltage in a vicinity of a maximum tolerable voltage of the horizontal deflection circuit, the horizontal deflection circuit operates at the fixed voltage in the vicinity of the maximum tolerable voltage when the input voltage of the limiter circuit is greater than the upper limit voltage, and the load on the horizontal deflection circuit is large. On the other hand, when the upper limit voltage of the limiter circuit is set to a voltage smaller than the maximum tolerable voltage of the horizontal deflection circuit, the load on the horizontal deflection circuit is reduced but the operating range of the VCO becomes narrow.

SUMMARY OF THE INVENTION

Accordingly, it is a general object of the present invention to provide a novel and useful limiter circuit in which the problems described heretofore are eliminated.

Another and more specific object of the present invention to provide a limiter circuit having an input versus output characteristic which is non-linear in a region outside a linear operating range thereof. According to the limiter circuit of the present invention, even when an input voltage thereof is outside the linear operating range of the limiter circuit, the voltage converges to a predetermined voltage within the linear operating range. Hence, in the case where the limiter circuit is used for limiting the amplitude of a phase error voltage which is used to control a VCO within a PLL circuit, for example, it is possible to make a setting time of the loop extremely short because the phase error voltage converges to the predetermined voltage within the linear operating range of the limiter circuit. In addition, in the case where the limiter circuit is used in a horizontal frequency oscillator circuit of a television receiver, for example, it is possible to set an operating range of a VCO to a wide range by setting the upper limit voltage of the limiter circuit to a voltage in a vicinity of a maximum tolerable voltage of a horizontal deflection circuit, and the horizontal deflection circuit operates at a voltage smaller than the maximum tolerable voltage thereof. Thus, the load on the horizontal deflection circuit is reduced even when the input voltage of the limiter circuit is greater than the upper limit voltage, and the limiter circuit functions as a protecting circuit in this case.

Other objects and further features of the present invention will be apparent from the following detailed description when read in conjunction with the accompanying drawings.

DETAILED DESCRIPTION

Figure 1:
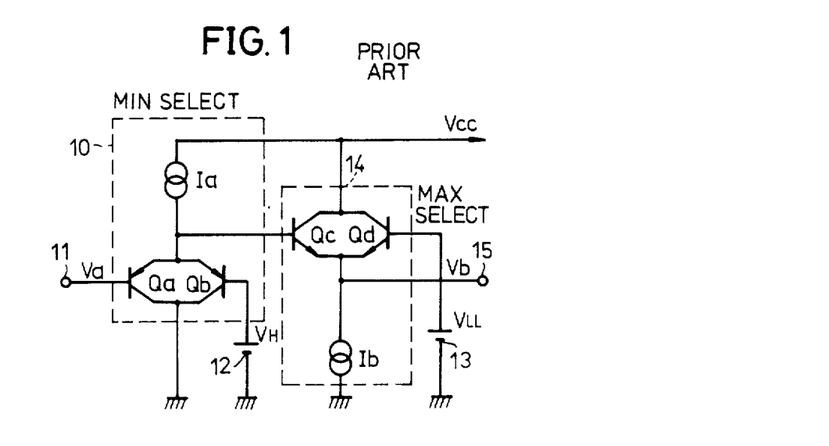
FIG. 1 is a system circuit diagram showing an example of the conventional limiter circuit.

FIG.1 shows an example of the conventional limiter circuit. PNP type transistors Qa and Qb and a current source Ia constitute a known minimum value selecting circuit 10. An input voltage Va from an input terminal 11 is applied to the base of the transistor Qa, and a D.C. voltage $V_H$ from a D.C. voltage source 12 is supplied to the base of the transistor Qb. On the other hand, NPN type transistors Qc and Qd and a current source Ib constitute a known maximum value selecting circuit 14. An output voltage of the minimum value selecting circuit 10 is supplied to the base of the transistor Qc, and a D.C. voltage $V_{LL}$ from a D.C. voltage source 13 is supplied to the base of the transistor Qd.

Accordingly, the minimum value selecting circuit 10 and the voltage source 12 function as a limiter which has the voltage $V_H$ as an upper limit voltage thereof. On the other hand, the maximum value selecting circuit 14 and the voltage source 13 function as a limiter which has a voltage $V_L$ as a lower limit voltage thereof, where $V_L = V_{LL} - V_{BE}$ and $V_{BE}$ is the base-emitter voltage of the transistor Qd.

Figure 2:
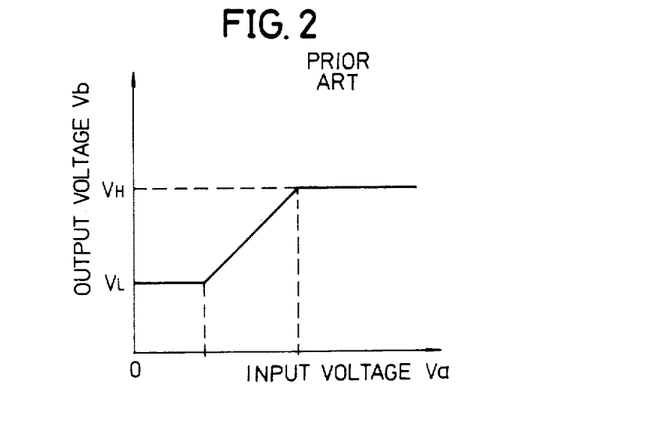
FIG. 2 is a graph showing an input versus output characteristic of the conventional limiter circuit shown in FIG.1.

As a result, the upper and lower limit amplitudes of the input voltage Va applied to the input terminal 11 are respectively limited to the voltages $V_H$ and $V_L$ as shown in FIG. 2, and a voltage Vb is outputted via an output terminal 15.

As an example of the use of the limiter circuit, there is the case where the limiter circuit is used in a phase locked loop (PLL) circuit which includes a phase comparator and a voltage controlled oscillator (VCO). The phase comparator compares the phases of an input signal of the PLL circuit and an output signal of the VCO, and an oscillation frequency of the VCO is controlled by an output phase error voltage of the phase comparator. However, when the input signal of the PLL circuit becomes discontinuous (or intermittent) for some reason, for example, the operation of the PLL is disturbed and the PLL carries out an erroneous operation. Hence, the limiter circuit is provided at an input stage of the VCO. The limiter circuit limits the amplitude of the output phase error voltage of the phase comparator to a predetermined amplitude range even when the input signal of the PLL circuit becomes discontinuous, so as to prevent the erroneous operation of the PLL circuit. But since the oscillation frequency of the VCO is controlled from the upper or lower limit frequency after the input signal of the PLL circuit becomes discontinuous and the PLL circuit becomes an open loop, there is a problem in that a long setting time is required for the loop operation to reach the steady state. In other words, in the case where the phase error voltage is greater than the upper limit voltage or is smaller than the lower limit voltage of the limiter circuit, the phase error voltage is limited and fixed to the upper or lower limit voltage, and the phase error voltage will not converge to a voltage within a linear operating range between the upper and lower limit voltages of the limiter circuit.

As another example of the use of the limiter circuit, there is the case where the limiter circuit is used in a horizontal frequency oscillator circuit of a television receiver. The horizontal frequency oscillator circuit includes a frequency-to-voltage converter supplied with an external synchronizing signal, the limiter circuit and a VCO. The frequency-to-voltage converter outputs a voltage dependent on a frequency of the external synchronizing signal supplied thereto, and the limiter circuit limits the amplitude of this voltage before supplying the voltage to the VCO and controls an oscillation frequency of the VCO. Hence, even when a signal dropout and noise exist within the external synchronizing signal, the output voltage of the frequency-to-voltage converter is limited to a predetermined amplitude range and the VCO is prevented from carrying out an erroneous operation. However, an output voltage of the VCO is supplied to a horizontal deflection circuit which operates at a high voltage. For this reason, when the operating range of the VCO is set to a wide range by setting the upper limit voltage of the limiter circuit to a voltage in a vicinity of a maximum tolerable voltage of the horizontal deflection circuit, the horizontal deflection circuit operates at the fixed voltage in the vicinity of the maximum tolerable voltage when the input voltage of the limiter circuit is greater than the upper limit voltage, and the load on the horizontal deflection circuit is large. On the other hand, when the upper limit voltage of the limiter circuit is set to a voltage smaller than the maximum tolerable voltage of the horizontal deflection circuit, the load on the horizontal deflection circuit is reduced but the operating range of the VCO becomes narrow.

The present invention eliminates the problems of the conventional limiter circuit by providing a limiter circuit having an input versus output characteristic which is non-linear in a region outside a linear operating range thereof.

Figure 3:
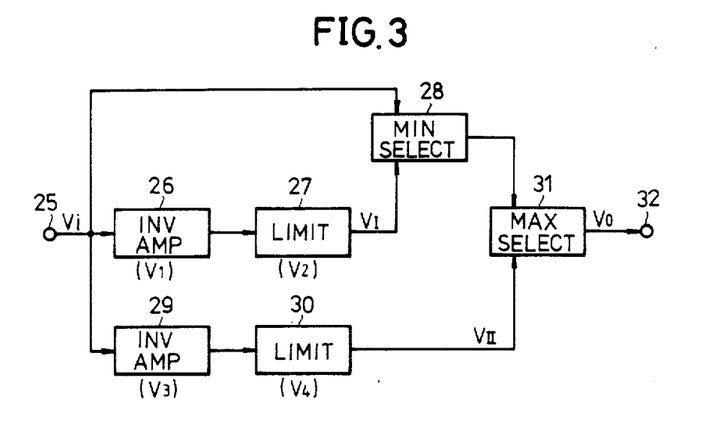
FIG. 3 is a system block diagram showing an embodiment of the limiter circuit according to the present invention.
Figure 4A:
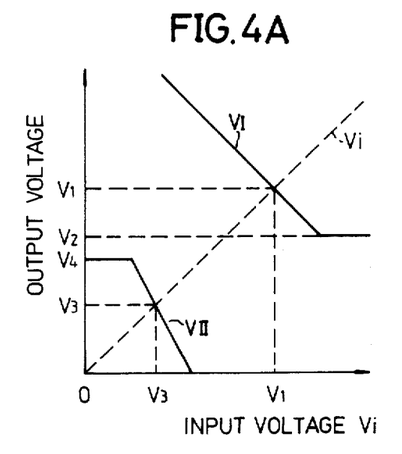
FIG. 4A is a graph showing voltages at various parts of the limiter circuit shown in FIG.3.

FIG. 3 shows an embodiment of the limiter circuit according to the present invention. In FIG. 4, first through fourth reference voltages V1 through V4 which will be described later are set so that the voltage V1 is greater than the voltage V2 and the voltage V4 is greater than the voltage V3 as shown in FIG. 4A. The relationship between the voltages V2 and V4 may be chosen arbitrarily. An input voltage Vi applied to an input terminal 25 is supplied to inverting amplifiers 26 and 29 and to a minimum value selecting circuit 28. The inverting amplifier 26 inverts and amplifies the input voltage Vi with such an input versus output characteristic that an output voltage of the inverting amplifier 26 decreases with an increase in the input voltage of the inverting amplifier 26 and is equal to the input voltage of the inverting amplifier 26 when the input voltage of the inverting amplifier 26 is equal to the first reference voltage V1.

The output voltage of the inverting amplifier 26 is supplied to a limiter 27 which limits the lower limit amplitude of the voltage to the second reference voltage V2. Hence, a voltage $V_f$ shown in FIG. 4A is obtained from the limiter 27 and is supplied to the minimum value selecting circuit 28.

The inverting amplifier 29 inverts and amplifies the input voltage Vi with such an input versus output characteristic that an output voltage of the inverting amplifier 29 increases with a decrease in the input voltage of the inverting amplifier 29 and is equal to the input voltage of the inverting amplifier 29 when the input voltage of the inverting amplifier 29 is equal to the third reference voltage V3.

The output voltage of the inverting amplifier 29 is supplied to a limiter 30 which limits the upper limit amplitude of the voltage to the fourth reference voltage V4. Hence, a voltage $V_{II}$ shown in FIG. 4A is obtained from the limiter 30 and is supplied to a maximum value selecting circuit 31.

The minimum value selecting circuit 28 compares the input voltage Vi and the voltage $V_I$ supplied thereto and selectively passes the smaller voltage. Thus, the minimum value selecting circuit 28 selectively outputs the inplut voltage Vi when $0 \leq Vi \leq V1$, and selectively outputs the voltage $V_I$ when $Vi > V1$.

On the other hand, the maximum value selecting circuit 31 compares the output signal of the minimum value selecting circuit 28 and the voltage $V_{II}$ supplied thereto, and selectively passes the larger voltage. Thus, the maximum value selecting circuit 31 selectively outputs the voltage $V_{II}$ when $0 \leq Vi < V3$, selectively outputs the input voltage Vi when $V3 \leq Vi \leq V1$, and selectively outputs the voltage $V_I$ when $Vi > V1$.

Figure 4B:
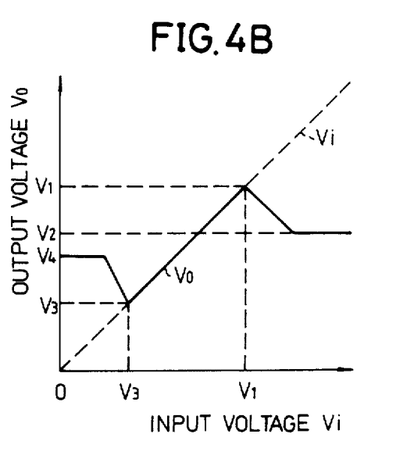
FIG. 4B is a graph showing an input versus output characteristic of the limiter circuit shown in FIG.3.

Therefore, an output voltage Vo indicated by a solid line in FIG. 4B is obtained from the maximum value selecting circuit 31 and is outputted via an output terminal 32. In other words, the limiter circuit has such an input versus output characteristic that the output voltage Vo is equal to the input voltage Vi in a linear region in which $V3 \leq Vi \leq V1$, the output voltage Vo converges to the second reference voltage V2 in a region in which $Vi > V1$, and converges to the fourth voltage V4 in a region in which $Vi < V3$. Accordingly, when the input voltage Vi is large or small and becomes outside the voltage range from V3 to V1, the limiter circuit of the present embodiment operates so that the output voltage Vo converges to a predetermined voltage between the maximum value V1 and the minimum value V3 of the linear operating range of the limiter circuit.

Figure 5:
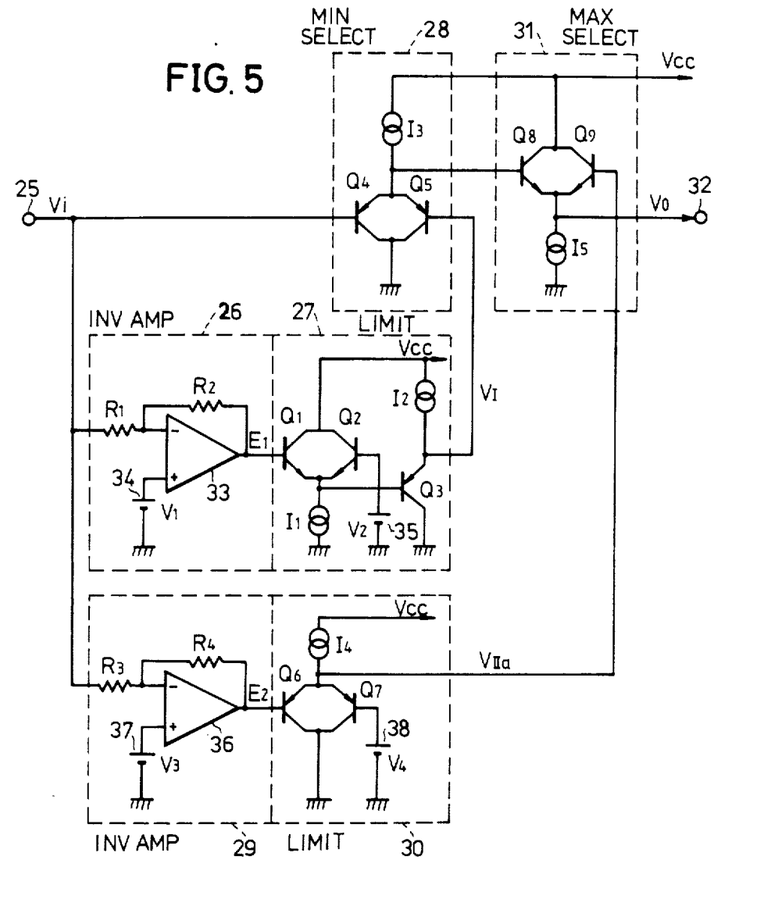
FIG. 5 is a system circuit diagram showing an embodiment of the concrete circuit construction of the limiter circuit according to the present invention.

FIG. 5 shows an embodiment of the concrete circuit construction of the limiter circuit according to the present invention. In FIG. 5, those parts which are the same as those corresponding parts in FIG. 3 are designated by the same reference numerals, and description thereof will be omitted. The inverting amplifier 26 comprises a known negative feedback amplifier constituted by an operational amplifier 33, a D.C. voltage source 34 for generating the first reference voltage V1, and resistors R1 and R2. The limiter 27 comprises NPN type transistors Q1 and Q2, current sources $I_1$ and $I_2$, a D.C. voltage source 35 for generating the second reference voltage V2, and a PNP type transistor Q3. The minimum value selecting circuit 28 comprises PNP type transistors Q4 and Q5 and a current source $I_3$.

The inverting amplifier 29 comprises a known negative feedback amplifier constituted by an operational amplifier 36, a D.C. voltage source 37 for generating the third reference voltage V3, and resistors R3 and R4. The limiter 30 comprises PNP type transistors Q6 and Q7, a current source $I_4$, and a D.C. voltage source 38 for generating the fourth reference voltage V4. The maximum value selecting circuit 31 comprises NPN type transistors Q8 and Q9 and a current source $I_5$.

In the inverting amplifier 26, a non-inverting input terminal of the operational amplifier 33 is grounded via the voltage source 34. On the other hand, an inverting input terminal of the operational amplifier 33 is coupled to the input terminal 25 via the resistor R1 and is also coupled to an output terminal of the operational amplifier 33 via the resistor R2. The base of the transistor Q1 of the limiter 27 is coupled to a connection point of the resistor R2 and the output terminal of the operational amplifier 33. The base of the transistor Q2 is grounded via the voltage source 35. The collectors of the transistors Q1 and Q2 are coupled in common to a power source voltage Vcc, and the emitters of the transistors Q1 and Q2 are grounded in common via the current source $I_1$. The emitters of the transistors Q1 and Q2 are also coupled in common to the base of the transistor Q3. The collector of the transistor Q3 is grounded. The emitter of the transistor Q3 is coupled to the power source voltage Vcc via the current source $I_2$ and is also coupled to the base of the transistor Q5 of the minimum value selecting circuit 28.

In the minimum value selecting circuit 28, the collectors of the transistors Q4 and Q5 are grounded in common. The emitters of the transistors Q4 and Q5 are coupled in common to the power source voltage Vcc via the current source $I_3$ and is also coupled to the base of the transistor Q8 of the maximum value selecting circuit 31.

In the inverting amplifier 29, a non-inverting input terminal of the operational amplifier 36 is grounded via the voltage source 37. On the other hand, an inverting input terminal of the operational amplifier 36 is coupled to the input terminal 25 via the resistor R3 and is also coupled to an output terminal of the operational amplifier 36 via the resistor R4. The base of the transistor Q6 of the limiter 30 is coupled to a connection point of the resistor R4 and the output terminal of the operational amplifier 36. The base of the transistor Q7 is grounded via the voltage source 38. The emitters of the transistors Q6 and Q7 are coupled in common to the power source voltage Vcc via the current source $I_4$, and the collectors of the transistors Q6 and Q7 are grounded in common. The emitters of the transistors Q6 and Q7 are also coupled in common to the base of the transistor Q9 of the maximum value selecting circuit 31.

In the maximum value selecting circuit 31, the collectors of the transistors Q8 and Q9 are coupled in common to the power source voltage Vcc. The emitters of the transistors Q8 and Q9 are grounded in common via the current source $I_5$ and are also coupled in common to the output terminal 32.

Next, description will be given with respect to the operation of the circuit shown in FIG. 5. When the resistances of the resistors R1 and R2 are respectively denoted by $r_1$ and $r_2$, an output voltage $E_1$ of the inverting amplifier 26 can be described by the following equation (1).

$$E_1 = -(r_1+r_2)/r_1 \times [r_2/(r_1+r_2) \times Vi - V1)] \qquad (1)$$

When Vi=V1 is substituted into the equation (1), $E_1$ becomes equal to V1. Accordingly, as described before in conjunction with FIG. 4A, $E_1 = V1$ when the input voltage Vi is equal to the first reference voltage V1, and the voltage $E_1$ which undergoes an inverted change with respect to the change of the input voltage Vi is obtained from the inverting amplifier 26.

The limiter 27 limits the lower limit voltage of the output voltage $E_1$ of the inverting emplifier 26 to the voltage V2 and outputs the voltage $V_I$ described before. When it is assumed that the base-emitter voltages of the transistors Q1 and Q2 are equal to the base-emitter voltage of the transistor Q3, $V_I = E_1$ when $E_1 > V2$ and $V_I = V2$ when $E_1 \leq V2$.

When the resistances of the resistors R3 and R4 are respectively denoted by $r_3$ and $r_4$, an output voltage $E_2$ of the inverting amplifier 29 can be described by the following equation (2).

$$E_2 = -(r_3+r_4)/r_3 \times [r_4/(r_3+r_4) \times Vi - V3)] \qquad (2)$$

When Vi=V3 is substituted into the equation (2), $E_2$ becomes equal to V3. Accordingly, as described before in conjunction with FIG.4A, $E_2$=V3 when the input voltage Vi is equal to the third reference voltage V3, and the voltage $E_2$ which undergoes an inverted change with respect to the change of the input voltage Vi is obtained from the inverting amplifier 29.

The limiter 30 limits the upper limit voltage of the output voltage $E_2$ of the inverting amplifier 29 to the voltage V4 and outputs a voltage $V_{IIa}$. When it is assumed that the base-emitter voltages of the transistors Q6 and Q7 and the base emitter voltages of the transistors Q4, Q5, Q8 and Q9 which will be described later are all equal to $V_{BEa}$, $V_{IIa}=E_2+V_{BEa}$ when $E_2<V4$ and $V_{IIa}+V4+V_{BEa}$ when $E_2 \geq V4$. In other words, the output voltage $V_{IIa}$ of the limiter 30 and the output voltage $V_{II}$ described before can be described by the equation $V_{IIa} = V_{II}+V_{BEa}$.

The transistors Q4 and Q5 of the minimum value selecting circuit 28 are turned ON and OFF depending on the magnitude relationship between the input voltage Vi and the voltage $V_I$ which are applied to the respective bases of the transistors Q4 and Q5. Similarly, the transistors Q8 and Q9 of the maximum value selecting circuit 28 are turned ON and OFF depending on the magnitude relationship between the output voltage of the minimum value selecting circuit 28 and the voltage $V_{IIa}$ which are applied to the respective bases of the transistors Q8 and Q9.

When Vi<V3, Vi<$V_I$ and the transistor Q4 is turned ON and the transistor Q5 is turned OFF. Hence, a voltage Vi+$V_{BEa}$ is obtained from the minimum value selecting circuit 28. In this state, Vi+$V_{BEa}$<$V_{IIa}$, the transistor Q8 is turned OFF and the transistor Q9 is turned ON. Accordingly, a voltage Vo=$V_{IIa}$−$V_{BEa}$=$V_{II}$ is obtained from the maximum value selecting circuit 31. As a result, when Vi<V3 and $E_2 \geq V4$, Vo=V4. On the other hand, when Vi<V3 and $E_2<V4$, Vo=$E_2$.

Next, when V3≤Vi≤V1, Vi≤$V_I$ and the transistor Q4 is turned ON and the transistor Q5 is turned OFF. Thus, a voltage Vi+$V_{BEa}$ is obtained from the minimum value selecting circuit 28. In this state, the transistor Q8 is turned ON and the transistor Q9 is turned OFF because Vi+$V_{BEa}$>$V_{IIa}$. Hence, a voltage Vo=(-Vi+$V_{BEa}$)−$V_{BEa}$=Vi is obtained from the maximum value selecting circuit 31, and the voltage equal to the input voltage Vi is obtained from the output terminal 32 when V3≤Vi≤V1.

Next, when Vi>V1, the transistor Q4 is turned OFF and the transistor Q5 is turned ON. Accordingly, a voltage $V_I$+$V_{BEa}$ is obtained from the minimum value selecting circuit 28. In this state, the transistor Q8 is turned ON and the transistor Q9 is turned OFF since $V_I$+$V_{BEa}$>$V_{IIa}$. For this reason, a voltage Vo=(-$V_I$+$V_{BEa}$) −$V_{BEa}$=$V_I$ is obtained from the maximum value selecting circuit 31. As a result, when Vi>V1 and $E_1$>V2, a voltage Vo=$E_1$ is obtained from the output terminal 32. On the other hand, when Vi>V1 and $E_1 \leq V2$, a voltage Vo=V2 is obtained from the output terminal 32.

Therefore, the circuit shown in FIG. 5 also functions as the limiter circuit having the input versus output characteristic shown in FIG. 4B.

Figure 6:
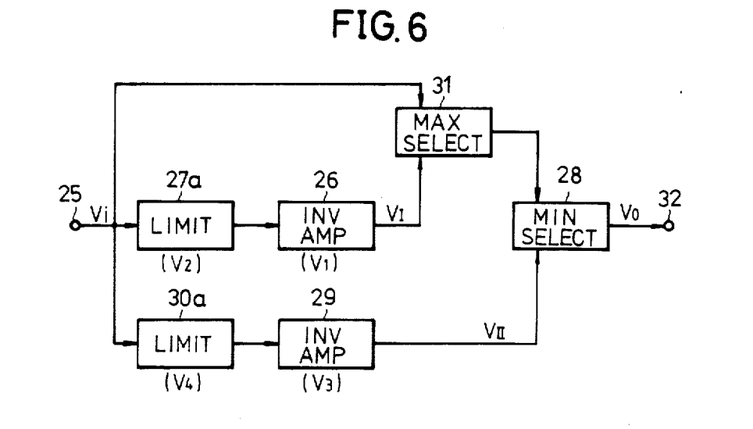
FIG. 6 is a system block diagram showing another embodiment of the limiter circuit according to the present invention.

The connections of the circuits shown in FIG. 3 are not limited to those of the embodiment described heretofore, and similar effects are obtainable as long as the minimum value selecting circuit 28 and the maximum value selecting circuit 31 are coupled in series. In other words, in the block system shown in FIG. 3, the connecting sequences of circuit pairs, that is, the inverting amplifier 26 and the limiter 27, the inverting amplifier 29 and the limiter 30, and the minimum value selecting circuit 28 and the maximum value selecting circuit 31, may be reversed as shown in another embodiment of the limiter circuit shown in FIG. 6. In FIG. 6, those parts which are the same as those corresponding parts in FIG. 3 are designated by the same reference numerals, and description thereof will be omitted. It is of course possible to reverse the connecting sequence of only one or two circuit pairs.

In FIG. 6, a limiter 27a limits the upper limit amplitude of the input voltage Vi to the second reference voltage V2, and the inverting amplifier 26 inverts and amplifies an output voltage of the limiter 27a with such an input versus output characteristic that an output voltage of the inverting amplifier 26 decreases with an increase in the input voltage of the inverting amplifier 26 and is equal to the input voltage of the inverting amplifier 26 when the input voltage of the inverting amplifier 26 is equal to the first reference voltage V1.

A limiter 30a limits the lower limit amplitude of the input voltage Vi to the fourth reference voltage V4, and the inverting amplifier 29 inverts and amplifies an output voltage of the limiter 30a with such an input versus output characteristic that an output voltage of the inverting amplifier 29 increases with a decrease in the input voltage of the inverting amplifier 29 and is equal to the input voltage of the inverting amplifier 29 when the input voltage of the inverting amplifier 29 is equal to the third reference voltage V3.

The maximum value selecting circuit 31 selectively outputs one of the input voltage Vi and an output voltage of the inverting amplifier 30 having the larger amplitude. The minimum value selecting circuit 28 selectively outputs one of an output voltage of the maximum value selecting circuit 31 and an output voltage of the inverting amplifier 26 having the smaller amplitude. The output voltage Vo is obtained from the minimum value selecting circuit 28 via the output terminal 32.

According to the limiter circuit of the present invention, the linear operating range is set by the inverting amplifiers 26 and 29, the limiter 27 and the limiter 30 which determine the lower limit voltage V3 and the upper limit voltage V1. Hence, it is of course possible to design the limiter circuit so as to have only the upper or lower limit voltage according to the needs. In the case where only the upper limit voltage is set, the inverting amplifier 29, the limiter 30 (or 30a) and the maximum value selecting circuit 31 may be omitted, and the output voltage Vo is obtained from the minimum value selecting circuit 28 which selectively outputs one of the input voltage Vi and the output voltage of the limiter 27 (or inverting amplifier 26) having the smaller value. On the other hand, in the case where only the lower limit voltage is set, the inverting amplifier 26, the limiter 27 (or 27a) and the minimum value selecting circuit 28 may be omitted, and the output voltage Vo is obtained from the maximum value selecting circuit 31 which selectively outputs one of the input voltage Vi and the output voltage of the limiter 30 (or inverting amplifier 29) having the larger value.

In the embodiment, when the input voltage is in a region outside the linear operating range of the limiter circuit, the output voltage is limited so as to linearly increase or decrease to a predetermined voltage in the linear operating range. However, it is not essential for the voltage to increase or decrease linearly to the predetermined voltage, and the voltage simply needs to non-linearly converge to the predetermined voltage.

Further, the present invention is not limited to these embodiments, but various variations and modifications may be made without departing from the scope of the present invention.

What is claimed is:

1. A limiter circuit comprising:
a first circuit supplied with an input voltage, said first circuit comprising a first inverting amplifier for inverting and amplifying a voltage supplied thereto with such an input versus output characteristic that an output voltage of said first inverting amplifier decreaes with an increase in an input voltage of said first inverting amplifier and is equal to the input voltage of said first inverting amplifier when the input voltage of said first inverting amplifier is equal to a first reference voltage and a first limiter for limiting a voltage supplied thereto to a second reference voltage, said first inverting amplifier and said first limiter being coupled in series in an arbitrary sequence, said first reference voltage being larger than said second reference voltage;
a second circuit supplied with said input voltage, said second circuit comprising a second inverting amplifier for inverting and amplifying a voltage supplied thereto with such an input versus output characteristic that an output voltage of said second inverting amplifier increases with a decrease in an input voltage of said second inverting amplifier and is equal to the input voltage of said second inverting amplifier when the input voltage of said second inverting amplifier is equal to a third reference voltage and a second limiter for limiting a voltage supplied thereto to a fourth reference voltage, said second inverting amplifier and said second limiter being coupled in series in an arbitrary sequence, said fourth reference voltage being larger than said third reference voltage; and
a third circuit supplied with said input voltage and output voltages of said first and second circuits for producing an output voltage of said third circuit having an amplitude thereof limited with a predetermined input versus output characteristic, said third circuit limiting the amplitude of said input voltage so that the amplitude of the output voltage of said third circuit non-linearly converges to said fourth reference voltage when said input voltage becomes smaller than said third reference voltage and the amplitude of the output voltage of said third circuit non-linearly converges to said second reference voltage when said input voltage becomes larger than said first reference voltage.

2. A limiter circuit as claimed in claim 1 in which said first inverting amplifier inverts and amplifies said input voltage and said first limiter limits a lower limit amplitude of the output voltage of said first inverting amplifier to said second reference voltage to thereby produce the output voltage of said first circuit.

3. A limiter circuit as claimed in claim 1 in which said first limiter limits an upper limit amplitude of said input voltage to said second reference voltage and said first inverting amplifier inverts and amplifies an output voltage of said first limiter to thereby produce the output voltage of said first circuit.

4. A limiter circuit as claimed in claim 1 in which said second inverting amplifier inverts and amplifies said input voltage and said second limiter limits the upper limit amplitude of an output voltage of said second inverting amplifier to thereby produce the output voltage of said second circuit.

5. A limiter circuit as claimed in claim 1 in which said second limiter limits a lower limit amplitude of said input voltage and said second inverting amplifier inverts and amplifies an output voltage of said second limiter to thereby produce the output voltage of said second circuit.

6. A limiter circuit as claimed in claim 1 in which said third circuit comprises a minimum value selecting circuit for selectively outputting one of said input voltage and the output voltage of said first circuit having a smaller value, and a maximum value selecting circuit for selectively outputting one of the output voltage of said second circuit and an output voltage of said minimum value selecting circuit having a larger value, said output voltage of said third circuit being obtained from said maximum value selecting circuit.

7. A limiter circuit as claimed in claim 1 in which said third circuit comprises a maximum value selecting circuit for selectively outputting one of said input voltage and the output voltage of said second circuit having a larger value, and a minumum value selecting circuit for selectively outputting one of the output voltage of said first circuit and an output signal of said maximum value selecting circuit having a smaller value, said output voltage of said third circuit being obtained from said minimum value selecting circuit.

8. A limiter circuit as claimed in claim 1 in which said second reference voltage is larger than said fourth reference voltage.

9. A limiter circuit as claimed in claim 1 in which said third circuit limits the amplitude of said input voltage so that the amplitude of the output voltage of said third circuit linearly increases to said fourth reference voltage when said input voltage becomes smaller than said third reference voltage and the amplitude of the output voltage of said third circuit linearly decreases to said second reference voltage when said input voltage becomes larger than said first reference voltage.

10. A limiter circuit comprising:
a first circuit supplied with an input voltage, said first circuit comprising an inverting amplifier for inverting and amplifying a voltage supplied thereto with such an input versus output characteristic that an output voltage of said inverting amplifier decreases with an increase in an input voltage of said inverting amplifier and is equal to the input voltage of said inverting amplifier when the input voltage of said inverting amplifier is equal to a first reference voltage and a limiter for limiting a voltage supplied thereto to a second reference voltage, said inverting amplifier and said limiter being coupled in series in an arbitrary sequence, said first reference voltage being larger than said second reference voltage; and a second circuit supplied with said input voltage and an output voltage of said first circuit for selectively outputting one of said input voltage and the output voltage of said first circuit having a smaller value, said second circuit limiting the amplitude of said input voltage so that the amplitude of an output voltage of said second circuit non-linearly converges to said second reference voltage when said input voltage becomes larger than said first reference voltage.

11. A limiter circuit comprising:

a first circuit supplied with an input voltage, said first circuit comprising an inverting amplifier for inverting and amplifying a voltage supplied thereto with such an input versus output characteristic than an output voltage of said inverting amplifier increases with a decrease in an input voltage of said inverting amplifier and is equal to the input voltage of said inverting amplifier when the input voltage of said inverting amplifier is equal to a first reference voltage and a lmiter for limiting a voltage supplied thereto to a second reference voltage, said inverting amplifier and said limiter being coupled in series in an arbitrary sequence, said second reference voltage being larger than said first reference voltage; and a second circuit supplied with said input voltage and an output voltage of said first circuit for selectively outputting one of said input voltage and the output voltage of said first circuit having a larger value, said second circuit limiting the amplitude of said input voltage so that the amplitude of an output voltage of said second circuit non-linearly converges to said second reference voltage when said input voltage becomes smaller than said first reference.

* * * * *

UNITED STATES PATENT AND TRADEMARK OFFICE
CERTIFICATE OF CORRECTION

PATENT NO. : 4,709,204

DATED : November 24, 1987

INVENTOR(S) : MITSURU HAYAKAWA

It is certified that error appears in the above-identified patent and that said Letters Patent is hereby corrected as shown below:

| | |
|---|---|
| Column 4, Line 50, | After "amplifier 26" insert---and is equal to the--- |
| Column 4, Line 51, | Should read "input voltage of the inverting" |
| Column 4, Line 54, | Begin "The output . . . " as a new sentence, not a new paragraph |
| Column 4, Line 62, | Complete the line with---that an output--- |
| Column 4, Line 63, | Should read "voltage of the inverting amplifier 29" |
| Column 4, Line 65, | After "amplifier 29" insert---and is equal to the--- |
| Column 4, Line 66, | Should read "input voltage of the inverting" |
| Column 5, Line 1, | Begin "The output . . . " as a new sentence, not a new paragraph |
| Column 8, Line 28, | After "26" insert---and is equal to--- |
| Column 8, Line 29, | Should read "the input voltage of the inverting" |

UNITED STATES PATENT AND TRADEMARK OFFICE
CERTIFICATE OF CORRECTION

PATENT NO. : 4,709,204
DATED : November 24, 1987
INVENTOR(S) : MITSURU HAYAKAWA

It is certified that error appears in the above-identified patent and that said Letters Patent is hereby corrected as shown below:

Column 8, Line 32,   Begin "A limiter 30a . . ." as a new stenence, not a new paragraph Column 8, Line 38,   After "amplifier 29" insert---and is equal to---

Column 8, Line 39,   Should read "the input voltage of the inverting"

Column 8, Line 42,   Begin "The maximum . . . " as a new sentence, not a new paragraph Column 9, Line 25,   Cancel "decreaes" and insert---decreases---

Signed and Sealed this

Twenty-first Day of June, 1988

Attest:

DONALD J. QUIGG

Attesting Officer      Commissioner of Patents and Trademarks